United States Patent
Shieh et al.

(10) Patent No.: US 9,129,868 B2
(45) Date of Patent: Sep. 8, 2015

(54) MASK LEVEL REDUCTION FOR MOFET

(75) Inventors: Chan-Long Shieh, Paradise Valley, AZ (US); Gang Yu, Santa Barbara, CA (US); Fatt Foong, Goleta, CA (US); Liu-Chung Lee, Goleta, CA (US)

(73) Assignee: CBRITE INC., Goleta, CA (US)

(*) Notice: Subject to any disclaimer, the term of this patent is extended or adjusted under 35 U.S.C. 154(b) by 444 days.

(21) Appl. No.: 13/481,781

(22) Filed: May 26, 2012

(65) Prior Publication Data

US 2012/0235138 A1     Sep. 20, 2012

Related U.S. Application Data

(63) Continuation-in-part of application No. 12/612,123, filed on Nov. 4, 2009, now Pat. No. 8,187,929.

(51) Int. Cl.
    *H01L 21/00*        (2006.01)
    *H01L 27/12*        (2006.01)

(52) U.S. Cl.
    CPC ........ *H01L 27/1288* (2013.01); *H01L 27/1225* (2013.01)

(58) Field of Classification Search
    CPC .................. H01L 27/1288; H01L 27/1225
    See application file for complete search history.

(56) References Cited

U.S. PATENT DOCUMENTS

| 8,723,179 B2 * | 5/2014 | Yun et al. | 257/59 |
| 2009/0146150 A1 * | 6/2009 | Hosoya | 257/59 |

FOREIGN PATENT DOCUMENTS

WO    WO2009120552    * 10/2009

* cited by examiner

*Primary Examiner* — Laura Menz
*Assistant Examiner* — Candice Y Chan
(74) *Attorney, Agent, or Firm* — Robert A. Parsons; Michael A. Goltry; Parsons & Goltry

(57) ABSTRACT

A method of fabricating a TFT and IPS with reduced masking operations includes a substrate, a gate, a layer of gate dielectric on the gate and surrounding substrate surface and a semiconducting metal oxide on the gate dielectric. A channel protection layer overlies the gate to define a channel area in the semiconducting metal oxide. A S/D metal layer is patterned on the channel protection layer and a portion of the exposed semiconducting metal oxide to define an IPS area. An organic dielectric material is patterned on the S/D terminals and at an opposed side of the IPS area. The S/D metal is etched to expose the semiconducting metal oxide defining a first IPS electrode. A passivation layer covers the first electrode and a layer of transparent conductive material is patterned on the passivation layer to define a second IPS electrode overlying the first electrode.

16 Claims, 10 Drawing Sheets

Mask 1: Metal1 & Com
Mask 2: a-Si
Mask 3: Metal-2 (S/D)
Mask 4: Organic & GI (Via-1)
Mask 5: Com ITO
Mask 6: Via-2
Mask 7: Pixel ITO

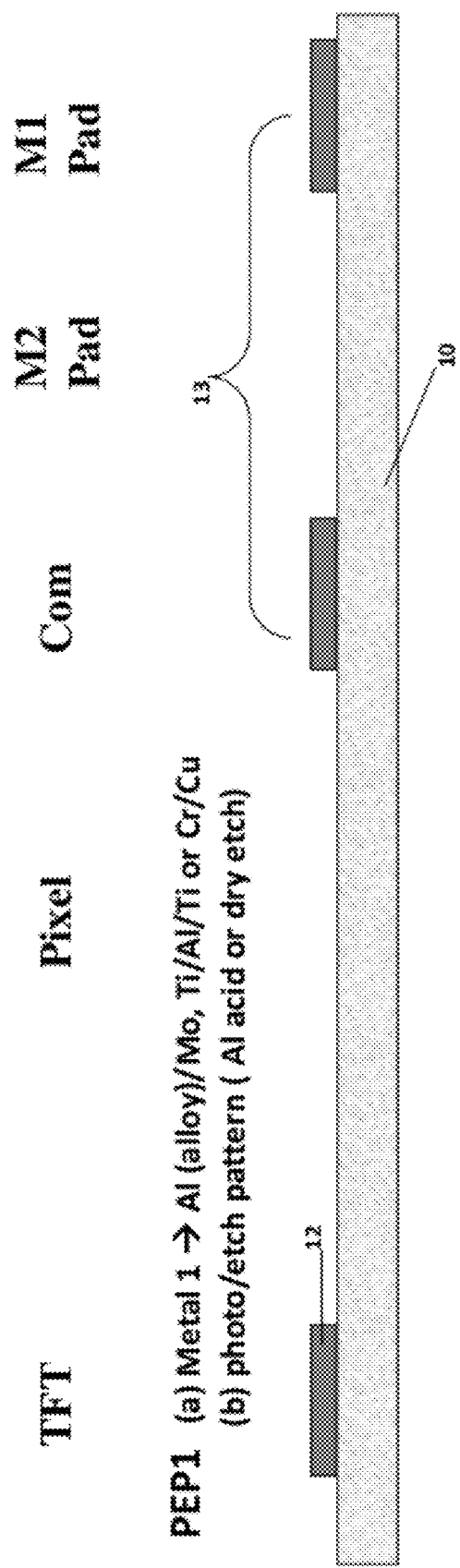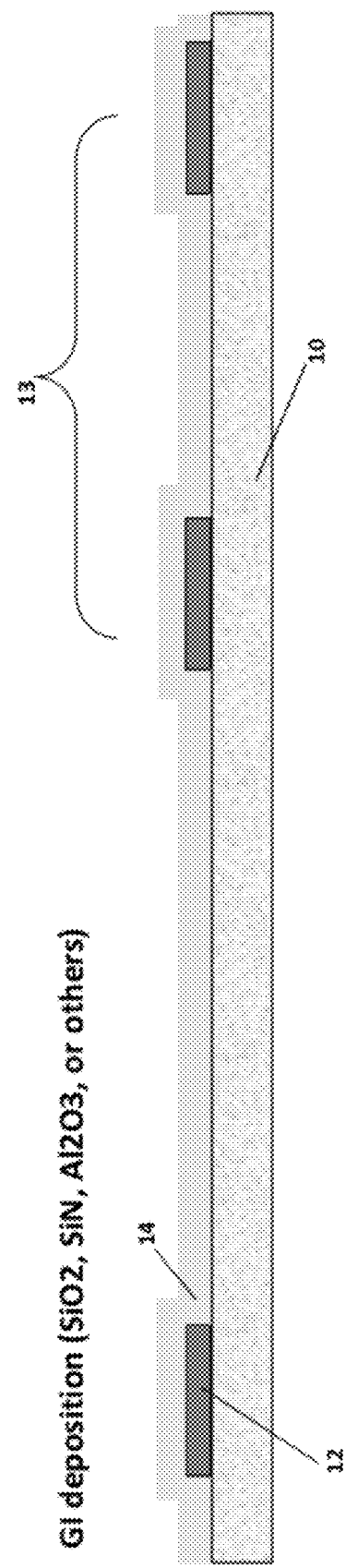

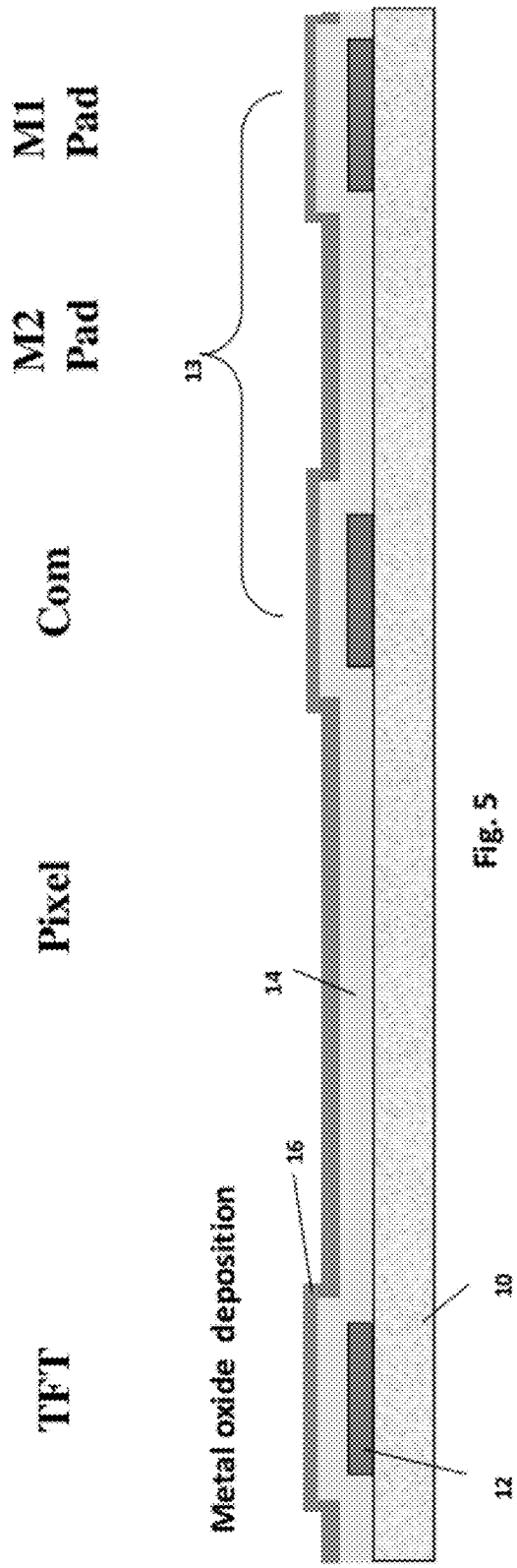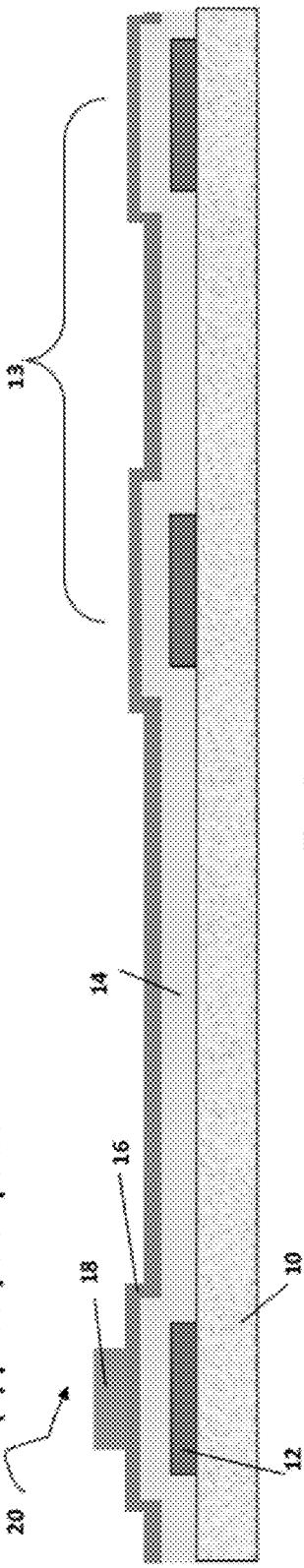
Fig. 5 Metal oxide deposition
Fig. 6 PEP2 (a) Etch stop layer deposition (SiOx or photosensitive organic material) (b) photo/etch pattern

US 9,129,868 B2

MASK LEVEL REDUCTION FOR MOFET

CROSS-REFERENCE TO RELATED APPLICATION

This is a continuation-in-part application claiming the benefit of copending U.S. patent application Ser. No. 12/612,123, filed 4 Nov. 2009.

FIELD OF THE INVENTION

This invention generally relates to a process in which the number of masks is reduced in active matrix production.

BACKGROUND OF THE INVENTION

In active matrix liquid crystal displays (AMLCD) and active matrix organic light emitting displays (AMOLED), there are requirements of conductive layers for different functionalities. For example, a metal layer is needed for the scan line and another metal layer is needed for the data line. These two lines cross over each other and cannot be formed during the same metal level steps. The conductivity of the metal lines for the data and scan lines is very critical and cannot be made from relatively low conductivity transparent material because of the conductivity requirement. Also, a transparent conductive layer is needed as the electrode for transmissive LCDs or bottom emitting OLEDs. It is not easy to combine or form the transparent conductor with the other metal lines. Each of the metal lines needs to be patterned in separate lithographic steps and contributes to the number of mask levels. Also, in the fabrication of AMLCDs and AMOLEDs there is another mask level, used in the formation of a spacer (in the case of an AMLCD), or a bank (in case of an AMOLEDs). It will be understood that banks or spacers are used to separate various layers in a complete display, e.g. a backplane from an emission layer. Each mask level in a process adds to the complexity and cost of the process.

More specifically, it has been noted that IPS (in-plane-switch) LCDs have become popular because of their wide viewing angle, insensitivity to finger-touching the viewing screen and better contrast. The insensitivity feature is important because many of the modern devices are at least partially controlled by touching the viewing screen. The problem with the IPS type of LCDs is that two patterned transparent electrodes are needed which results in a requirement of seven (7) patterning steps. This invention builds on the novel fabrication process for AMLCDs and AMOLEDs of the parent application in which the number of mask levels is reduced and reduces the number of mask levels required in the fabrication process of metal-oxide based TFT backpanels for IPS LCDs.

Accordingly, it is an object of the present invention to provide a new and improved fabrication process for metal-oxide based TFT backpanels for IPS LCDs in which the number of mask levels is reduced.

It is another object of the present invention to provide a new and improved metal-oxide based TFT backpanel for IPS type of LCDs which is more compact and includes fewer layers of material.

It is yet another object of the present invention to provide a new and improved metal-oxide based TFT backpanel for IPS LCD with reduced power consumption.

SUMMARY OF THE INVENTION

Briefly, to achieve the desired objects of the instant invention in accordance with a preferred embodiment thereof, provided is a method of fabricating a thin film transistor backpanel for in-plane-switch AMLCD with reduced masking operations. The method includes the step of providing a substrate with a surface, patterning gate metal on the surface of the substrate to define a thin film transistor gate, forming a layer of gate dielectric over the gate and surrounding substrate surface, and depositing a layer of semiconducting metal oxide on the layer of gate dielectric. The method further includes the steps of patterning a channel protection layer on the semiconducting metal oxide overlying the gate. The channel protection layer is patterned to define a channel area in the semiconducting metal oxide above the gate and to expose the remaining semiconducting metal oxide. The following steps are performed generally in the sequence listed. At least a source/drain metal layer is deposited on the channel protection layer and a portion of the exposed semiconducting metal oxide defining the first electrode for in-plane-switch LCD imaging element. The source/drain metal layer is etched through to the channel protection layer above the gate to separate the source/drain metal layer into thin film transistor source and drain terminals and through the semiconducting metal oxide layer in areas not covered by the source/drain metal layer. An organic dielectric material is deposited and patterned on the thin film transistor source and drain terminals and at an opposed side of the first electrode for the in-plane-switch LCD pixel. The source/drain metal layer is etched through, using the patterned organic dielectric material, in the in-plane-switch area to expose the semiconducting metal oxide and define a first transparent electrode for an in-plane-switch LCD element. A passivation layer is deposited on the patterned organic dielectric material and the first electrode for the in-plane-switch and a layer of transparent electrically conductive material is patterned on the passivation layer to define a second electrode for the in-plane-switch overlying the first electrode.

The desired objects of the instant invention are further achieved in a thin film transistor (TFT) and in-plane-switch (IPS) constructed for incorporation into an AMLCD. The interconnected TFT and IPS include a substrate with a surface, gate metal patterned on the surface of the substrate defining a thin film transistor gate, a layer of gate dielectric positioned over the gate and surrounding substrate surface, and a layer of semiconducting metal oxide positioned on the layer of gate dielectric. A channel protection layer is positioned on the semiconducting metal oxide overlying the gate. The channel protection layer is patterned to define a channel area in the semiconducting metal oxide above the gate and to expose the remaining semiconducting metal oxide. At least a source/drain metal layer is positioned on the channel protection layer and a portion of the exposed semiconducting metal oxide defining an in-plane-switch area spaced laterally from the channel area and the source/drain metal layer. The source/drain metal layer is separated into thin film transistor source and drain terminals. An organic dielectric material is positioned on the thin film transistor source and drain terminals and at surrounding area of the first electrode area for in-plane-switch LCD. The S/D metal layer in the first electrode area can be removed at this stage, and expose the semiconducting metal oxide and defines a first transparent electrode for in-plane-switch LCD element. A passivation layer is positioned on the organic dielectric material and the first electrode for the in-plane-switch and a layer of transparent electrically conductive material is positioned on the passivation layer defining a second electrode for the in-plane-switch overlying the first electrode.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 3 through 7 are simplified sectional views illustrating sequential steps in a process for fabricating metal-oxide based TFTs in an active matrix display.

DETAILED DESCRIPTION OF THE DRAWINGS

Figure 1:
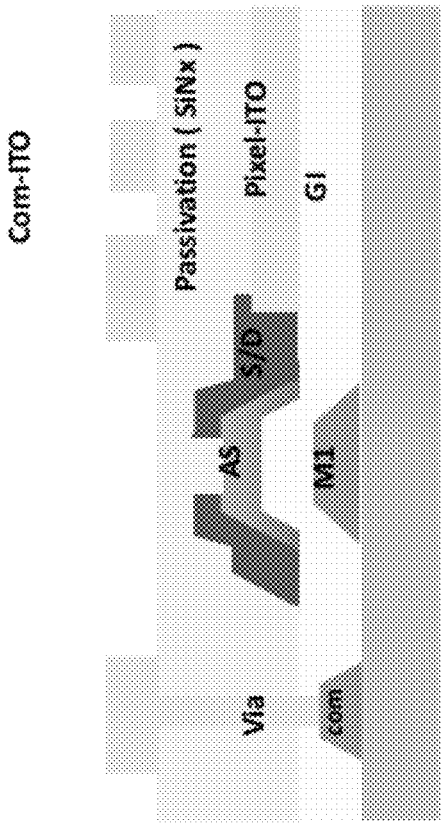
FIG. 1 is a simplified sectional view of a prior art in-plane-switch (IPS) in an active matrix liquid crystal display (AM-LCD)

Referring specifically to FIG. 1, a simplified sectional view of a prior art in-plane-switch (IPS) in an active matrix liquid crystal display (AMLCD) is illustrated. Throughout this description a single element is illustrated for convenience but it will be understood that a complete display is composed of a matrix of pixels with each pixel including one or more of the illustrated single elements. The single element includes an LCD and a field effect transistor (FET) pixel driver, which is generally a thin film transistor (TFT). The TFT is activated or controlled by a scan line connected to the gate and a data line connected to the source/drain (S/D) terminals.

In the prior art or state of the art in-plane-switch (IPS) and TFT of FIG. 1, a substrate (glass) is provided and a gate (M1) and electrical connection (COM) are patterned on the substrate in a first patterning step. A gate dielectric insulator (GI) and an active layer or semiconductor channel of a-Si (AS), are patterned on the gate in a second patterning step. The components are surrounded by a first layer of insulating material and a pixel electrode (pixel-ITO) is patterned on the insulating material in a third patterning step. The metal source and drain contacts (S/D) are patterned on the active layer and the pixel electrode in a fourth patterning step. A second layer of insulating material is deposited over the metal source and drain contacts and the active layer and the pixel electrode. A via or through-hole is formed through the two insulation layers to connect with the gate connection on the substrate in a fifth patterning step. In a sixth or final patterning step the common electrode (Com-ITO) for the in plane switch is formed on the second layer of insulating material and through the via to contact the gate.

The common electrode, in this structure, includes multiple interconnected, spaced apart fingers. As understood in the art, the common electrode forms a field in cooperation with the pixel electrode, that loops upwardly between the fingers in the space above the common electrode when the in plane switch is activated by activating the TFT. The upwardly looping field is situated in the liquid crystal layer to alter the transmission of light in a well-known manner.

The insulating layer between the pixel electrode and the common electrode cannot be too thick or the electrodes will not generate a field sufficient to operate the LCD. Also, the common electrode must be separated from the source/drain contacts sufficiently to prevent un-wanted interaction through capacitive coupling. The typical insulating layer is 200 nm thick and is generally formed of SiN. Because of the necessity in this structure to place the various conductors close, it is understood that the capacitance per element is very large. The parasitic capacitive coupling of the common electrode to other metal lines such as data lines and gate lines is significant so that the structure is virtually unusable without decoupling layers therebetween. This large parasitic capacitance leads to excessive power consumption for the driving electronics and the parasitic power consumption is worse for higher frame displays such as 120 Hz or 240 Hz. As illustrated in FIG. 1, six mask levels are required for a standard a-Si TFT array for in-plane-switch AMLCD without any decoupling layers.

Figure 2:
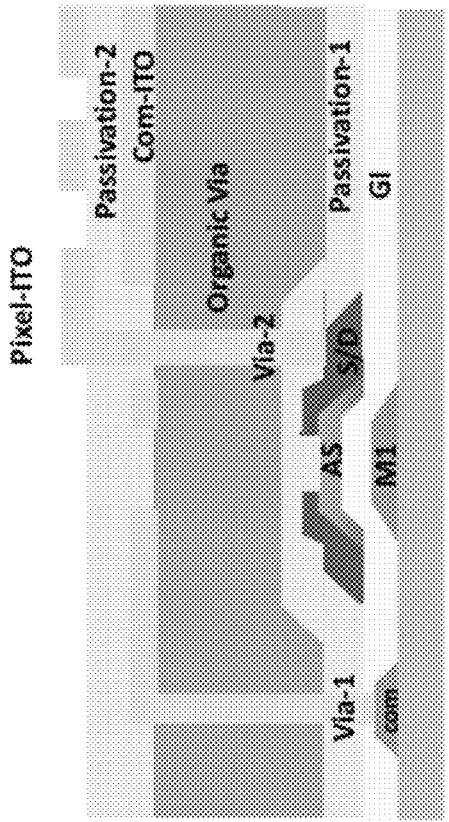
FIG. 2 is a simplified sectional view of a prior art in plane switch including an improvement over the IPS illustrated in FIG. 1.

To overcome the problems inherent in the structure illustrated in FIG. 1, an in-plane-switch in an active matrix liquid crystal display (AMLCD) with decoupling layer as illustrated in FIG. 2 was developed in the prior art. In the decoupled in-plane-switch (IPS) and TFT of FIG. 2, a substrate (glass) is provided and a gate (M1) and electrical connection (COM) are patterned on the substrate in a first patterning step. A gate dielectric insulator (GI) is blanket deposited and an active layer or semiconductor channel of a-Si (AS) is patterned over the gate in a second patterning step. The components are surrounded by a first layer of insulating material (Passivation-1) and a thick organic decoupling layer is deposited over the insulating layer. A first via or through-hole (Via-1) is formed through the decoupling layer and the first insulation layer (GI) to the gate connection on the substrate in a fourth patterning step. A common electrode (Com-ITO) is deposited on the organic decoupling layer and through the first via to connect with the gate connection on the substrate in a fifth patterning step. A second layer of insulating material (Passivation-2) is blanket deposited over the common electrode. A second via or through-hole (Via-2) is formed through the two insulation layers and the decoupling layer to the source/drain contact in a sixth patterning step. In a seventh or final patterning step a pixel electrode (PITO) for the in-plane-switch is formed on the second layer of insulating material and through the second via to contact the source/drain. In this structure the pixel electrode is the multiple interconnected, spaced apart fingers.

It can be seen that the electrodes of the in-plane-switch have been moved sufficiently far from the metal leads and the TFT to substantially reduce the parasitic capacitance and enable the circuit functioning properly with lower power consumption. However, seven mask levels are required for a standard a-Si in-plane-switch and TFT without any decoupling layers. Moreover, the via-2 at each pixel takes substantial real-estate space that reduces the aperture ratio of the AMLCD. Further, due to limited carrier mobility in a-Si TFTs, substantial wide/length ratio and thus large TFT size are also needed to provide sufficient pixel current during switch "ON" time. These factors above become limiting factors for small-size, high pixel count displays for portable applications due to limited aperture ratio (the transparent LCD element area over the entire pixel area). Increasing light intensity in backlight units leads to high power consumption, high capacity of rechargeable battery, the system weight and self-heating during operation.

Turning now to FIGS. 3 through 7, sequential steps are illustrated in a process for fabricating the FET or TFT in an element for an IPS-LCD display. Referring specifically to FIG. 3, a transparent substrate 10 is provided which may be any material desired for the specific application, e.g. plastic, glass, etc. It could be in either rigid or flexible form. As a first step in the preferred process, gate metal layer 12 is deposited and patterned onto the surface of substrate 10 to form a gate pattern for the TFT. The patterning of gate metal layer 12 requires the first mask level. Gate metal layer 12 preferably includes one of Al (generally an alloy)/Mo, Ti/Al/Ti or Cu/Mo and is preferably patterned with a photo/etch pattern (wet etching or dry etch process). It should be noted that several contacts, metal lines, additional circuitry including external access to the TFT or in-plane-switch, etc., designated 13 for convenience, are illustrated at the right-hand portion of the various figures. Components 13 are illustrated for overall process of contact areas in MOTFT backpanels.

In a second step of the process, illustrated in FIG. 4, a gate dielectric layer 14 is deposited on gate metal layer 12 and the surrounding surface of substrate 10. The gate dielectric may include $SiO_x$, $SiN_x$, $Al_2O_3$, $Ta_2O_5$ or combinations thereof in either single composite layer or a multi-layer stack. No fine mask patterning is required at this stage. Note that while a single thin film transistor (TFT) is illustrated in the steps depicted in FIGS. 3-7 for simplicity, it should be understood that a complete array of LCDs or OLEDs in AMLCDs or AMOLEDs, respectively, is being fabricated, some of which might be included in circuitry 13.

Turning to FIG. 5, a semiconducting metal oxide layer 16 (preferably amorphous metal oxide) is deposited on gate dielectric layer 14. No fine mask level is required for the deposition of semiconducting metal oxide layer 16 since it is substantially a blanket deposition. As illustrated specifically in FIG. 6, a channel protection layer 18 is patterned on top of metal oxide layer 16 and in overlying relationship to gate 12 to substantially define the channel of the thin film transistor, hereinafter referred to as transistor 20. The formation and positioning of channel protection layer 18 requires the second mask level. Layer 18 may include $SiO_x$, $Ta_2O_5$, $Al_2O_3$, or photosensitive organic material, or their combination in stacking form or blend form and is preferably patterned with a photo/etch process. Examples of photo-patternable organic materials include poly(methyl methacrylate), PMMA, polyimide, PI, SU8 (a photopatternable epoxy) and other crosslinkable organic dielectric molecules known to experts in the field.

Figure 7:
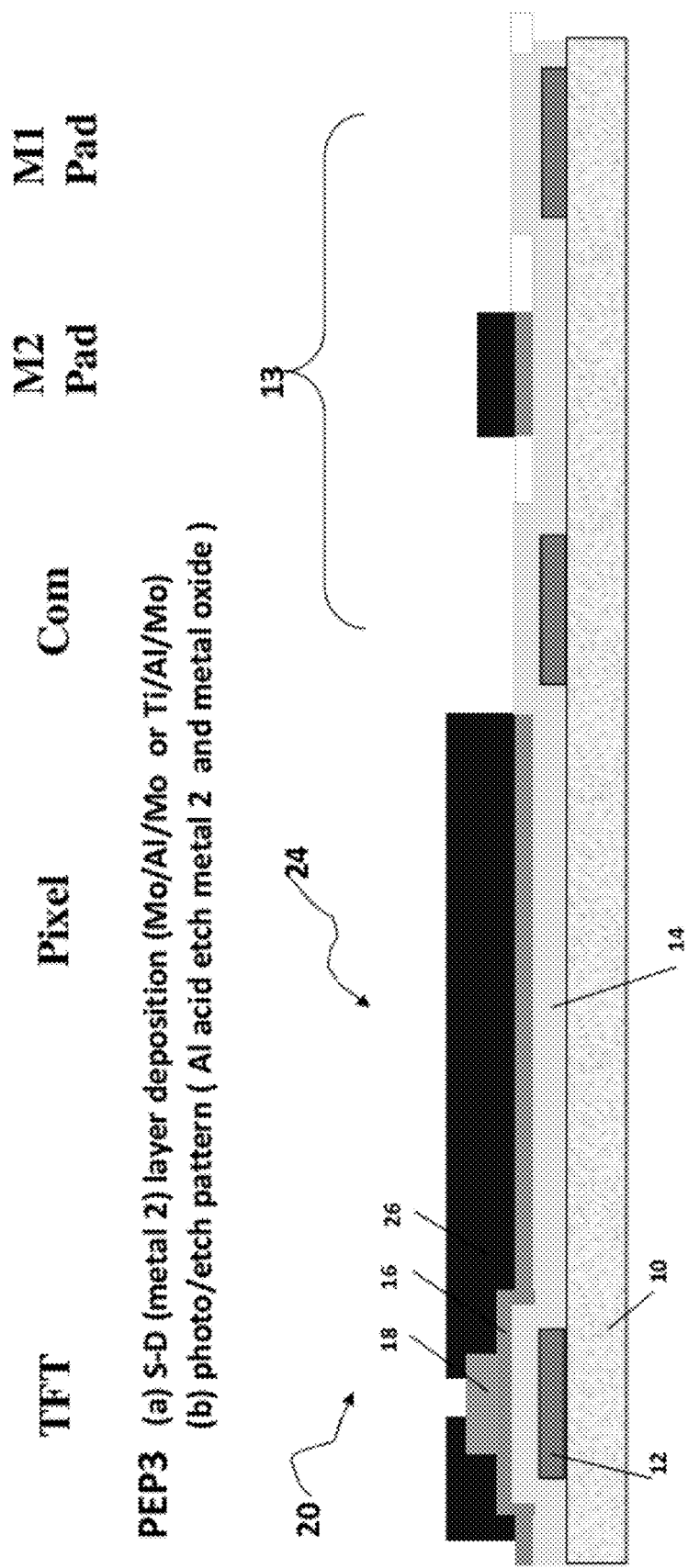

Turning to FIG. 7, a source/drain (S/D) metal layer 26 is deposited over transistor 20 including protection layer 18 and a central area 24, including a substantial portion of semiconducting metal oxide layer 16 between transistor 20 and additional circuitry 13. Layer 26 of S/D metal may be any convenient conductive metal, such as molybdenum, aluminum, copper, gold, Ti, Ta or combinations of materials such as Mo/Al/Mo or Ti/Al/Ti or Ti/Al/Mo, or the like. An optional transparent conductor metal oxide (TCO) may be deposited on metal oxide channel layer 16 and an optional barrier metal layer (also included in layer 26) may be deposited on the surface of the transparent oxide conductor layer. The transparent oxide conductor of layer may be, for example, ITO, IZO, AZO, $In_2O_3$ or the like and the barrier metal may be, for example, Mo, W, Cr, Pt, Ni, Ag, etc. It will be understood that the transparent oxide conductor and the barrier layers are optional and depend generally upon the application and the specific type of materials used in the various layers. No fine mask level is required for the deposition of the optional layers or layer 26 since each is substantially a blanket deposition.

The single or optional multiple layer stack, including layer 26 (and any optional specific layers present), is then patterned by the S/D mask, or the third mask level. In this step an etch mask is used and the etching goes through layer 26 to channel protection layer 18 above gate 12 and through layer 26 and metal oxide semiconductor 16 elsewhere (i.e. to the left of transistor 20 and in the area of circuitry 13 to the right of area 24 other than the contact pads for data buslines in area 13). The result of this etch is the TFT designated 20 and area 24. It will be noted that no additional metal oxide isolation mask is required. The etching outside the channel achieves the isolation of metal oxide semiconductor layer 16 from adjacent components. As understood by the artisan, gate metal layer 12 is generally connected to a scan line of the matrix and S/D metal layer 26 is connected to a data line of the display matrix and to additional components of the display element.

Figure 8:
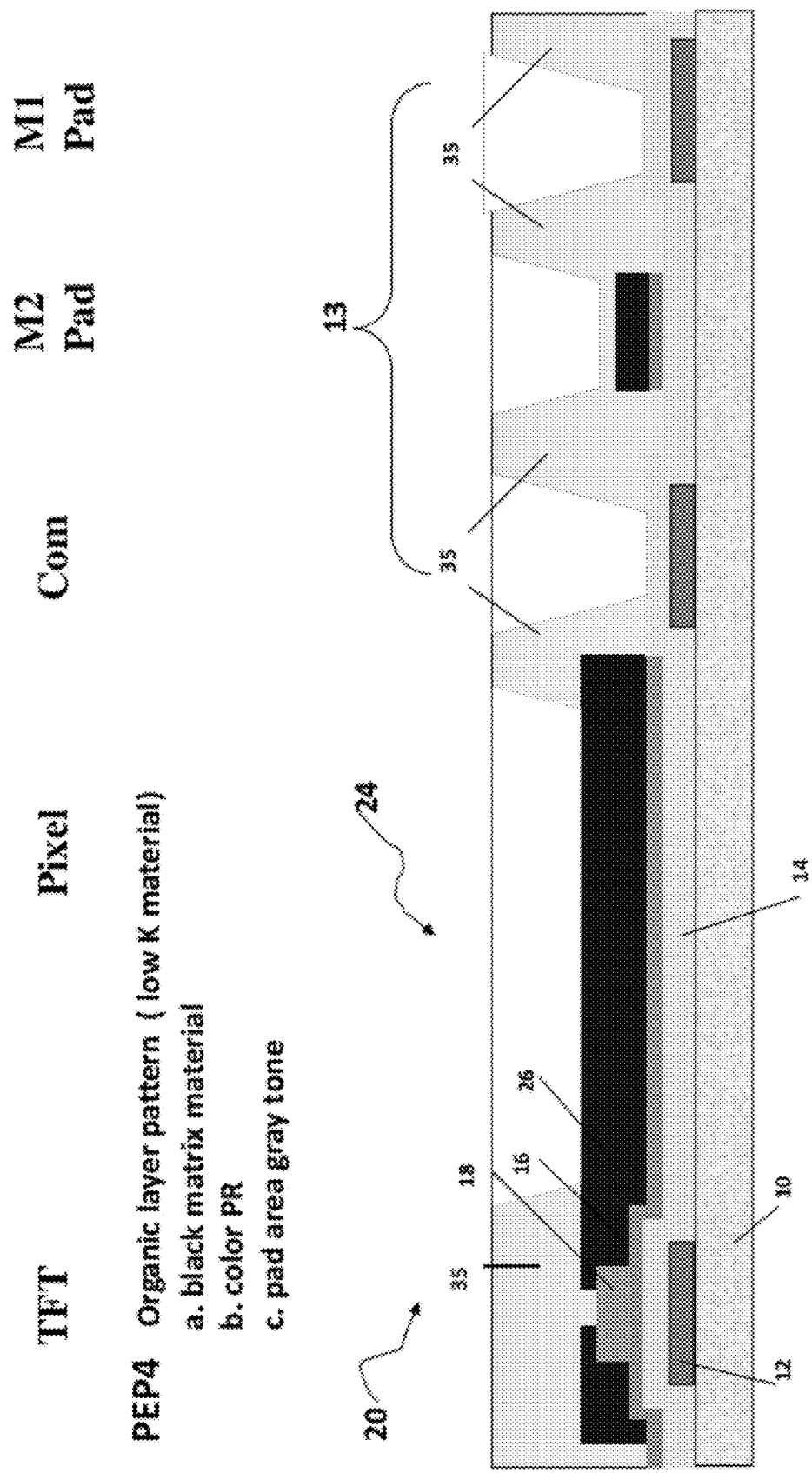
FIGS. 8 through 12 are simplified sectional views illustrating sequential steps in fabricating in-plane-switch LCD electrodes and contact pads for the MOTFT backpanel.

Turning now to FIG. 8, a decoupling layer 35 is patterned (the fourth mask level) on TFT 20 and portions of area 13, specifically overlying the breaks between or edges of metal contacts of area 13. In addition to fully removed layer 35 in area 24 and area 13, the layer 35 on M2 pad in area 13 can be patterned partially down by half-tone or gray tone mask design. Decoupling layer 35 is a low dielectric constant (low k) material and can be a single layer or multiple layers and at least one of the multiple layers can be a black matrix (an example includes Dow Chemical black on array series materials such as BoA BM TBNB-X) or other color filtering material (such as used in green or red filter) to block UV light from impinging on TFT 20. Patterning decoupling layer 35 is the fourth mask level in the process. In the case without optional TCO or barrier metal layer, the conductivity of the channel metal-oxide layer exposed (in area 24) can be increased to needed level for pixel electrode (typically in $10^2$-$10^3$ ohm per square) can be achieved by properly baking the panel in nitrogen or vac environment at elevated temperature or through surface reaction during the following deposition or patterning processes.

Figure 9:
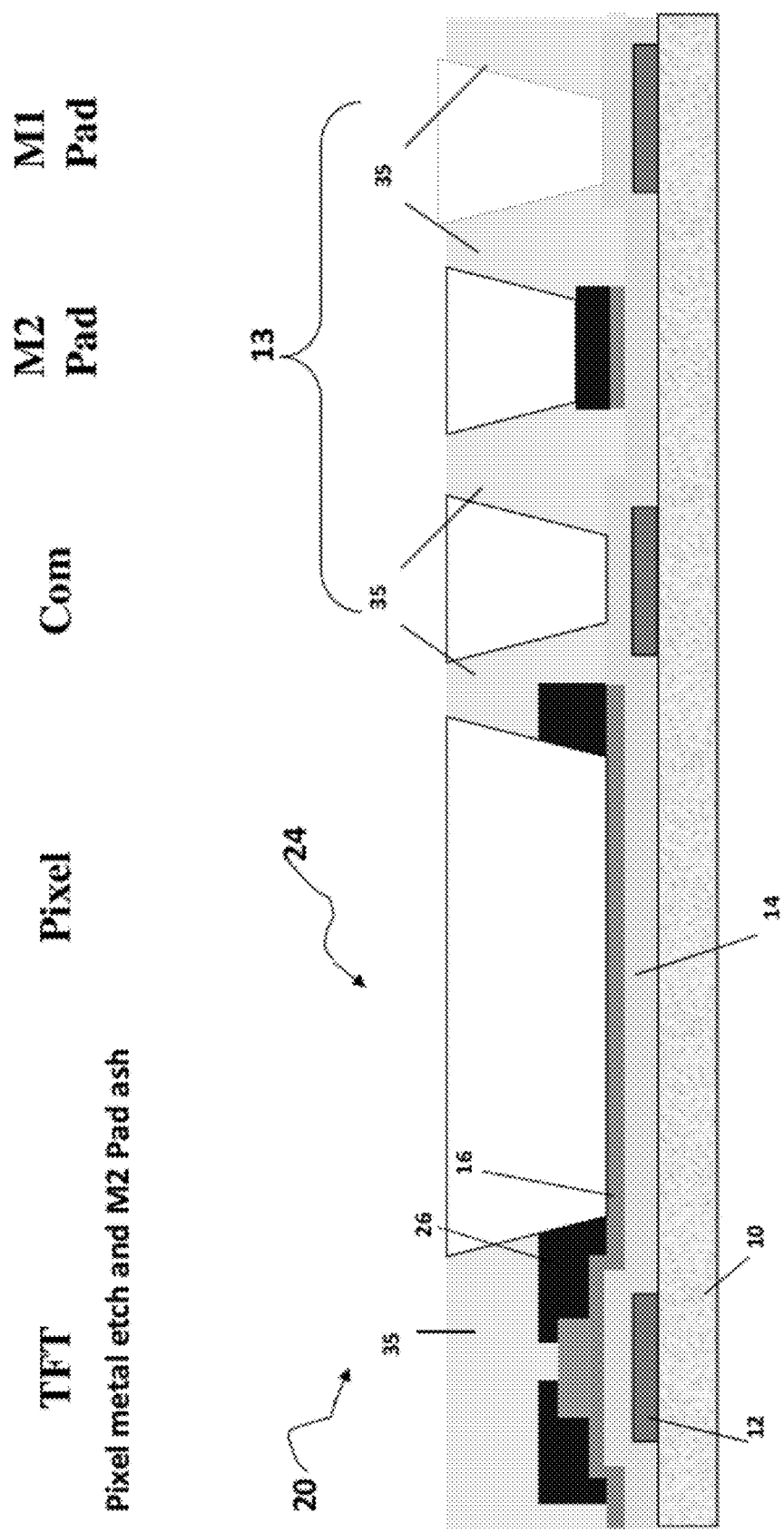

As can be seen in FIG. 9, the remaining portions of decoupling layer 35 are used as an etch mask to remove the portion of conductive metal 26 in area 24, which exposes the surface of metal oxide semiconductor layer 16. It should be understood at this point that layer 26 is removed in area 24 but any optional underlying layers, such as the transparent oxide conductor and the barrier metal layer (if it is thin enough to be transparent) may be retained to improve the conductivity of that portion of metal oxide semiconductor layer 16. As will be understood from the following description, the portion of metal oxide semiconductor layer 16 and any optional layers retained in area 24 form the lower electrode in the in-plane-switch (IPS) LCD element.

Figure 10:
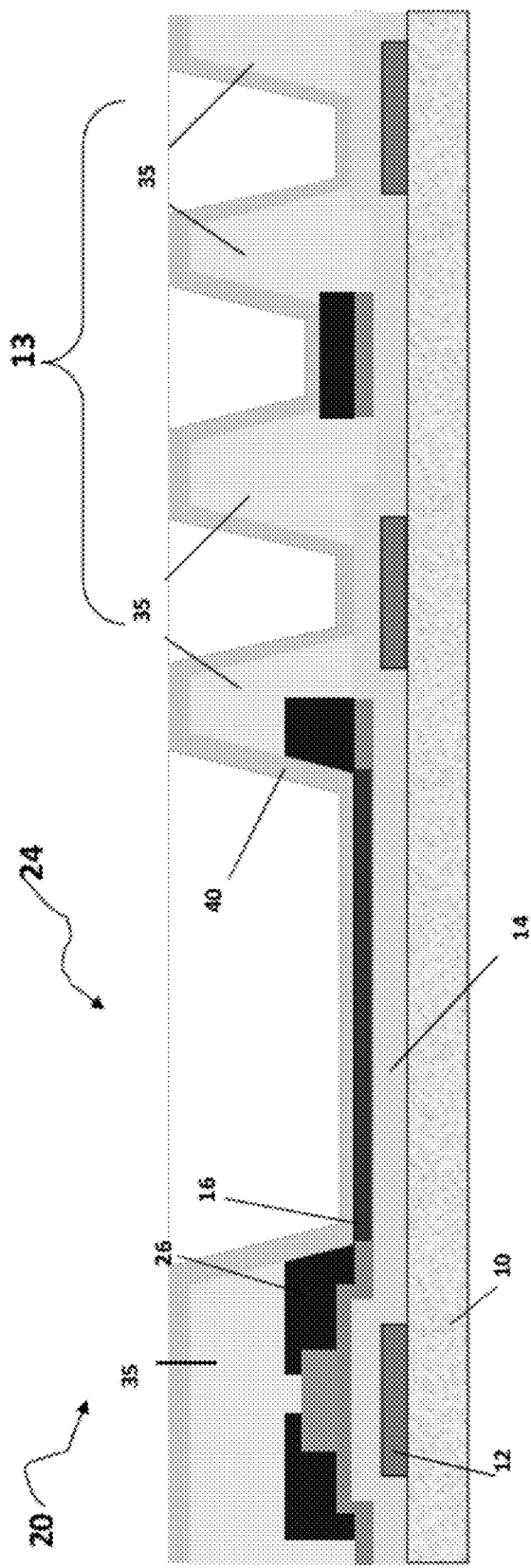

Referring to FIG. 10, a passivation layer 40 is deposited by a blanket deposition which does not require any masks or the like. Passivation layer 40 includes an inorganic non-conducting material, such as $SiN_x$, $Ta_2O_5$, $Al_2O_3$ or the like. It will be noted that layer 40 can be formed thin enough to maximize the operating field generated by the two electrodes of the in-plane-switch (IPS). A via patterning mask is used to remove portions of layer 40 and gate dielectric layer 14 to provide vias 42 between portions of decoupling layer 35 in area 13 (e.g. in Com and M1 pad areas). In the M2 pad area, this mask just remove the layer 40. The via patterning mask is the fifth mask level in the process.

It is worth noting that a properly designed process for depositing layer 40 can also increase the semiconducting metal oxide layer underneath (in area 24) to needed level. For example, SiN layer deposition at 150-250° C. for 200-300 nm thickness can tune the semiconductor channel metal-oxide 16 to metallic phase with surface resistance in $10^2$-$10^3$ ohm per square.

Figure 11:
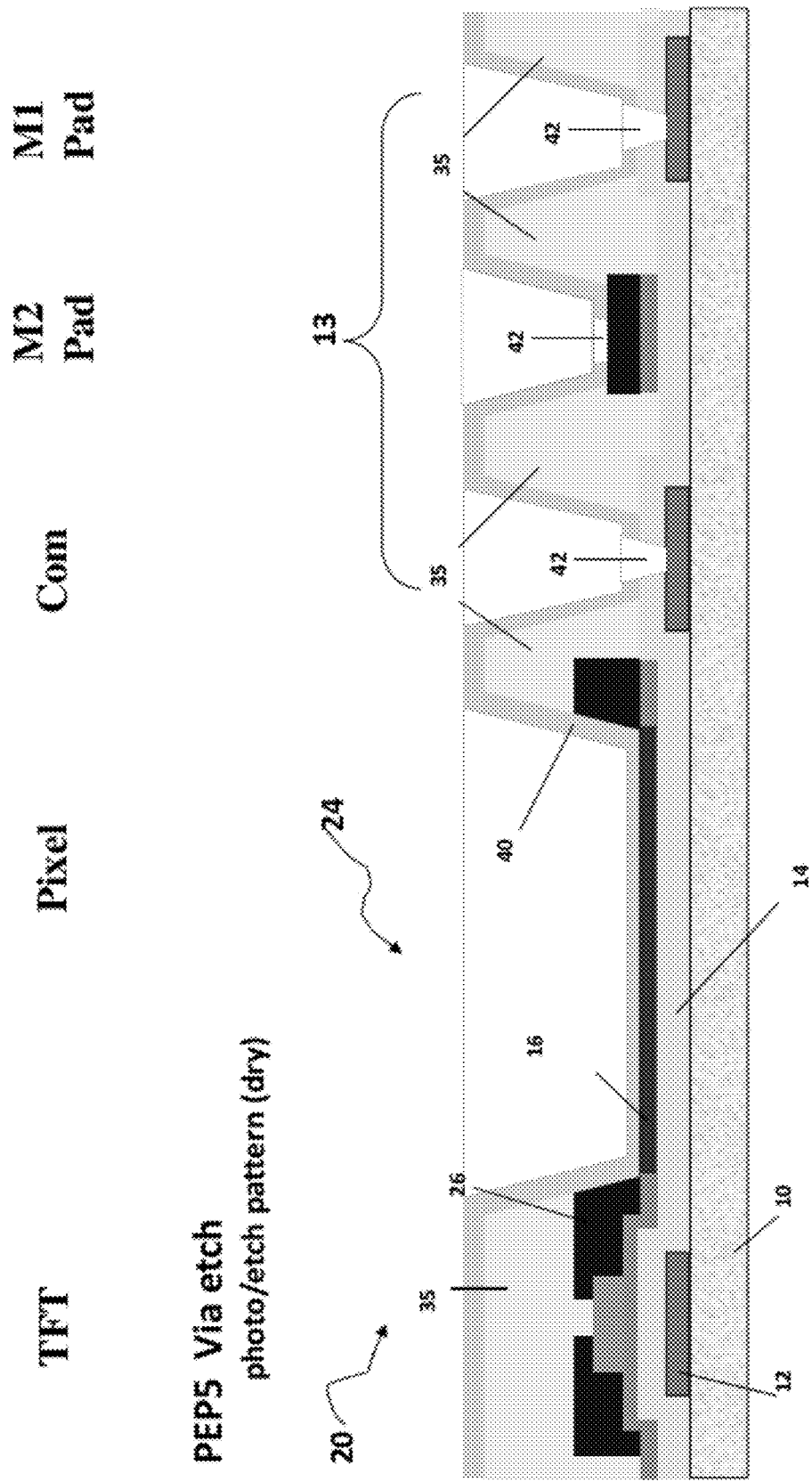

FIG. 11 shows the $5^{th}$ mask step which is opening vias in area 13. This is a standard photo and dry etching process known to the display industry. In some applications, area 13 can be arranged out of the display array area so that the size of via and patterning accuracy can be relaxed compared to the design rule for the TFT area (zone 20).

Figure 12:
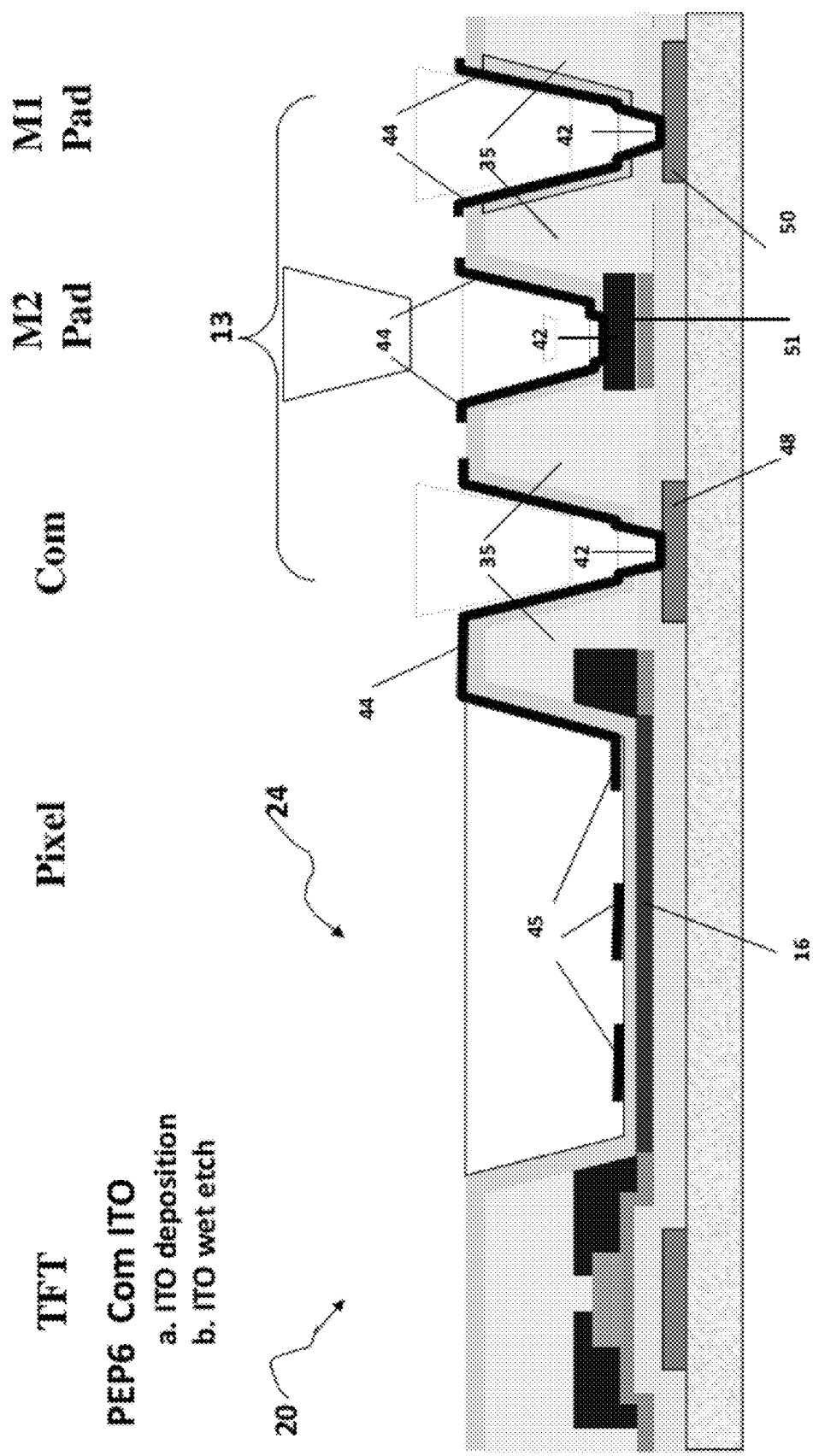

Turning to FIG. 12, a sixth and final masking level is performed by patterning a layer 44 of transparent conductive material on selected portions of passivation layer 40. Included in the selected portions is a top electrode 45 on the surface of passivation layer 40 in the area 24. Layer 44 of transparent conductive material can include materials such as ITO, InZnO, AlZnO, In$_2$O$_3$, combinations thereof, and the like. Top electrode 45 includes multiple interconnected, spaced apart fingers that cooperate with the portion of metal oxide semiconductor layer 16 situated in area 24 to form the top and bottom electrodes for IPS-LCD. Top electrode 45 and metal oxide semiconductor layer 16 cooperate to generate a field that loops upwardly between the fingers in the space within area 24 when the in-plane-switch is activated by activating TFT 20. The sixth patterning step also deposits portions of conductive layer 44 on the portions of decoupling layer 35 in area 13 and through vias 42 between portions of decoupling layer 35 in area 13. Conductive layer 44 in a first via 42 and extending over a first portion of decoupling layer 35 connects top electrode 45 to a metal lead 48 for external electrical access. Also, the next vias 42 are electrically isolated from each other but electrically connect additional metal contacts/leads 50 and 51 to the display (for example, the contact pads used connecting row and column drivers circuit on silicon chip to the data buslines and gate buslines in the peripheral area of the display). By forming the electrical connections between the illustrated active matrix and the associated display panel (not shown) with conductive layer 44 on the tops of the portions of decoupling layer 35 (which can be considered bonding pads), chip-on-glass (COG) and chip-on-flex (COF) processes can be conveniently accommodated without adverse effects.

In addition to being used for fabricating pixel circuits for IPS AMLCD, this process flow can also be used for constructing column or raw drivers in the peripheral area of the display. In such circuits, connection between M1 and M2 is often needed. Such connection can be easily achieved by connecting M1 and M2 pads with the layer 44.

It will be understood that parasitic capacitance is substantially eliminated by the present invention without the need for a thick organic decoupling layer as used in the prior art and illustrated in FIG. 2. This results in substantial power reduction on driving the IPS AMLCD. In addition, by using the semiconductor metal oxide layer as the lower electrode of the IPS LCD element, a process step is eliminated and the entire fabrication process is greatly simplified. Thus, not only is the fabrication process improved and simplified by requiring less steps, the active matrix produced is easier to use, includes less material, and is highly adaptable to COG/COF driver integration process. Since the connection of the top electrode 45 serves the common electrode in the IPS AMLCD, the connection to busline does not have to be done at each pixel level. This factor, along with the high mobility MOTFT (and thus smaller dimensions of it), enable display pixels with large aperture ratio. Aperture ratios over 60% can be achieved for a single color sub-pixel pitch below 75 um×25 um.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a thin film transistor and in-plane-switch LCD electrodes with reduced masking operations, the method comprising the steps of:
   providing a substrate with a surface;
   patterning gate metal on the surface of the substrate to define a thin film transistor gate;
   forming a layer of gate dielectric over the gate and surrounding substrate surface;
   depositing a layer of semiconducting metal oxide on the layer of gate dielectric;
   patterning a channel protection layer on the semiconducting metal oxide overlying the gate, the channel protection layer being patterned to define a channel area in the semiconducting metal oxide above the gate and to expose the remaining semiconducting metal oxide;
   depositing at least a source/drain metal layer on the channel protection layer and a portion of the exposed semiconducting metal oxide defining an in-plane-switch area;
   etching through the source/drain metal layer to the channel protection layer above the gate to separate the source/drain metal layer into thin film transistor source and drain terminals, and etching through the semiconducting metal oxide layer in areas not covered by the source/drain metal layer;
   patterning an organic dielectric material on the thin film transistor source and drain terminals and at surrounding area of the first electrode for the in-plane-switch;
   using the patterned organic dielectric material, etching through the source/drain metal layer in the in-plane-switch area to expose the semiconducting metal oxide and define a first electrode for an in-plane-switch;
   depositing a passivation layer on the patterned organic dielectric material and the first electrode for the in-plane-switch; and
   patterning a layer of transparent electrically conductive material on the passivation layer defining a second electrode for the in-plane-switch overlying the first electrode.

2. A method as claimed in claim 1 wherein the second electrode for the in-plane-switch includes multiple interconnected, spaced apart fingers.

3. A method as claimed in claim 1 wherein the step of depositing the layer of semiconducting metal oxide includes depositing an amorphous metal oxide.

4. A method as claimed in claim 1 wherein the step of patterning the layer of transparent electrically conductive material includes patterning a layer of one of ITO, IZO, AZO, In$_2$O$_3$ and combinations thereof.

5. A method as claimed in claim 1 wherein the step of depositing at least the source/drain metal layer includes depositing a layer of transparent metal oxide conductor on the organic dielectric material.

6. A method as claimed in claim 5 wherein the step of depositing the layer of transparent metal oxide conductor includes depositing one of ITO, IZO, AZO, In$_2$O$_3$ and combinations thereof.

7. A method as claimed in claim 5 wherein the step of depositing at least the source/drain metal layer includes depositing a barrier metal layer on the transparent metal oxide conductor and depositing the source/drain metal layer on the barrier metal layer.

8. A method as claimed in claim 7 wherein the step of etching through the source/drain metal layer in the in-plane-switch area includes etching through the barrier layer but not etching through the layer of transparent metal oxide conductor.

9. A method as claimed in claim 7 wherein the step of depositing the barrier metal layer includes depositing one of Mo, W, Cr, and Ni.

10. A method of fabricating a thin film transistor and in-plane-switch LCD electrodes with six patterning/masking operations, the method comprising the steps of:

providing a substrate with a surface;

a first patterning/masking operation including patterning gate metal on the surface of the substrate to define a thin film transistor gate and contacts/leads for external electrical connections to the thin film transistor and in-plane-switch;

forming a layer of gate dielectric over the gate and the contacts/leads and surrounding substrate surface;

depositing a layer of semiconducting metal oxide on the layer of gate dielectric;

a second patterning/masking operation including patterning a channel protection layer on the semiconducting metal oxide overlying the gate, the channel protection layer being patterned to define a channel area in the semiconducting metal oxide above the gate and to expose the remaining semiconducting metal oxide;

depositing at least a source/drain metal layer on the channel protection layer and a portion of the exposed semiconducting metal oxide defining an in-plane-switch area;

a third patterning/masking operation including etching through the source/drain metal layer to the channel protection layer above the gate to separate the source/drain metal layer into thin film transistor source and drain terminals, and etching through the semiconducting metal oxide layer over the contacts/leads;

a fourth patterning/masking operation including patterning an organic dielectric material on the thin film transistor source and drain terminals and at an opposed side of the first electrode for the in-plane-switch;

using the patterned organic dielectric material, etching through the source/drain metal layer in the in-plane-switch area to expose the semiconducting metal oxide and define a first electrode for an in-plane-switch;

depositing a passivation layer on the patterned organic dielectric material and the first electrode for the in-plane-switch;

a fifth patterning/masking operation including etching vias through the passivation layer and the layer of gate dielectric into communication with the contacts/leads; and a sixth patterning/masking operation including patterning a layer of transparent electrically conductive material on the passivation layer defining a second electrode for the in-plane-switch overlying the first electrode and through the vias into contact with the contacts/leads.

11. A method as claimed in claim 10 wherein the second electrode for the in-plane-switch includes multiple interconnected, spaced apart fingers.

12. A method as claimed in claim 10 wherein the step of depositing the layer of semiconducting metal oxide includes depositing an amorphous metal oxide.

13. A method as claimed in claim 10 wherein the step of patterning the layer of transparent electrically conductive material includes patterning a layer of one of ITO, IZO, AZO, $In_2O_3$ and combinations thereof.

14. A method as claimed in claim 10 wherein the step of depositing at least a source/drain metal layer includes depositing a layer of transparent metal oxide on the exposed semiconducting metal oxide prior to depositing the source/drain metal layer.

15. A method as claimed in claim 14 wherein the step of depositing at least the source/drain metal layer includes depositing a barrier metal layer on the layer of transparent metal oxide prior to depositing the source/drain metal layer.

16. A method as claimed in claim 15 wherein the step of depositing the barrier metal layer includes depositing one of Mo, W, Cr, and Ni.

* * * * *